US006518598B1

(12) United States Patent
Chen

(10) Patent No.: US 6,518,598 B1
(45) Date of Patent: Feb. 11, 2003

(54) III-NITRIDE LED HAVING A SPIRAL ELECTRODE

(75) Inventor: Shi-Ming Chen, No. 10, Da-Shuen 9th Rd., Tainan Science-Based Industrial Park, Hsinshi, Tainan County (TW)

(73) Assignees: Epitech Corporation LTD, Hsinshi Tainan County (TW); Shi-Ming Chen, Tainan (TW)

( * ) Notice: Subject to any disclaimer, the term of this patent is extended or adjusted under 35 U.S.C. 154(b) by 0 days.

(21) Appl. No.: 10/052,588

(22) Filed: Jan. 23, 2002

(30) Foreign Application Priority Data

Dec. 21, 2001 (TW) ...................................... 090131946 A

(51) Int. Cl.[7] ............................................... H01L 33/00
(52) U.S. Cl. ............................ 257/91; 257/81; 257/84; 257/88; 257/93; 257/94; 257/99; 257/690; 257/698; 257/700
(58) Field of Search .............................. 257/81, 84, 88, 257/92, 93, 98, 99, 100, 690, 698, 700

(56) References Cited

U.S. PATENT DOCUMENTS 5,952,680 A * 9/1999 Strite .......................... 257/88
6,255,129 B1 * 7/2001 Lin ............................... 438/26

* cited by examiner

*Primary Examiner*—Long Pham
*Assistant Examiner*—Wai-Sing Louie
(74) *Attorney, Agent, or Firm*—Sughrue Mion, PLLC

(57) ABSTRACT

A structure of III-nitride light emitting diode (LED) having spiral electrodes and a manufacturing method thereof. The present invention uses an etching or polishing method to form a spiral-shaped trench in the surface of the epitaxial structure of LED, so that two metal electrodes having opposite electrical properties, formed in following steps, have the spiral-shaped pattern structures in parallel. The structure of III-nitride LED having spiral electrodes formed by the method of the present invention can evenly distribute the injected current between two electrodes having opposite electrical properties, thereby having the advantages of good current-spreading efficiency and the uniform light-emitting area. In addition, the photon ejected to the surface of diode produced with a large angle can be extracted from the side of the trench that is exposed by etching spiral-shaped pattern, so that the extraction efficiency of photon is increased.

10 Claims, 3 Drawing Sheets

III-NITRIDE LED HAVING A SPIRAL ELECTRODE

FIELD OF THE INVENTION

The present invention relates to a structure of III-nitride light emitting diode (LED) and a manufacturing method thereof. More particularly, the present invention relates to the structure of III-nitride LED having spiral-shaped pattern electrodes, and the manufacturing method for making the same.

BACKGROUND OF THE INVENTION

Nowadays, because LED has advantages of low manufacturing cost, low manufacturing difficulty level, easy and convenient installation and promising development future, LED is used widely in daily life, such as electronic bulletin boards, indicator lights and car taillights, etc. However, how to further enhance the irradiation efficiency of LED is still a target on which engineers are working.

FIG. 1 a illustrates a top view of a structure of conventional III-nitride LED, and FIG. 1b illustrates a cross-sectional view of a structure of conventional III-nitride LED along the A–A' line in the FIG. 1a. Referring to FIG. 1a and FIG. 1b first, an epitaxial structure is formed by forming a buffer layer 14, a semiconductor layer 16 having a first electrical property, a confining layer 18 having the first electrical property, an active layer 20, a confining layer 22 having a second electrical property, and a contact layer 24 having the second electrical property in sequence on a substrate 12. Next, the aforementioned epitaxial structure is etched or polished to expose a portion of the semiconductor layer 16 having the first electrical property. Then, a transparent electrode 26 having the second electrical property, a metal electrode pad 30 having the second electrical property, and a metal electrode pad 28 having the first electrical property are formed on the epitaxial structure respectively, such as shown in FIG. 1a.

The transparent electrode 26 having the second electrical property is used in the structure of the convention LED 10 to increase the current-spreading efficiency. In fact, most of the current 32 is concentrated within the shortest distance between the transparent electrode 26 having the second electrical property and the metal electrode pad 28 having the first electrical property, such as shown in FIG. 1b. Hence, the light-emitting area of LED 10 is mostly concentrated on the area on which the transparent electrode 26 having the second electrical property is close to the metal electrode pad 28 having the first electrical property, causing a poor light-emitting efficiency. Besides, due to the over-concentrated current, the temperature in local area is too high so that the life of conventional LED 10 is shortened. Although the prior art can increase the thickness of the transparent electrode 26 having the second electrical property to improve the current-spreading efficiency, yet as a result of that, the light permeability of the transparent electrode 26 having the second electrical property is reduced.

Further, in the conventional LED 10, if the photon produced from the light-emitting layer is ejected to the surface of diode with a large angle, it easily leads to the loss of total reflection, thereby reducing the extraction efficiency.

SUMMARY OF THE INVENTION

In view of the disadvantages of the conventional LED structure, the present invention provides a structure of III-nitride LED and a manufacturing method thereof to overcome the disadvantages of the conventional LED structure directly and effectively.

According to the present invention, the structure of III-nitride LED having spiral electrodes comprises: a substrate; an epitaxial structure located on the substrate, the epitaxial structure comprising a first stacked sub-structure located on the substrate, and a second stacked sub-structure formed in a spiral-shaped pattern on the first stacked structure, wherein the second stacked sub-structure has a trench exposing a side of the second stacked sub-structure and a portion of the surface of first stacked sub-structure; a first metal electrode having a first electrical property, wherein the first metal electrode having the first electrical property is in the trench and is located on the portion of the surface of first stacked sub-structure in the spiral-shaped pattern along the second stacked sub-structure, and the first metal electrode having the first electrical property is connected with a first metal electrode having the first electrical property pad having the first electrical property; and an ohmic electrode having a second electrical property, wherein the ohmic electrode is located on the second stacked sub-structure, and the second electrical property is opposite to the first electrical property, the ohmic electrode having the second electrical property comprising a transparent electrode having the second electrical property on the second stacked sub-structure, and a second metal electrode having the second electrical property, wherein the second metal electrode having the second electrical property is located on the transparent electrode having the second electrical property and the second metal electrode having the second electrical property is connected with a second metal electrode pad having the second electrical property. Further, according to the present invention, the method of manufacturing the structure of III-nitride LED having spiral electrodes is described as follows.

According to the present invention, the III-nitride LED having spiral electrodes can increase the current-spreading efficiency due to the spiral-shaped pattern of electrodes. Besides, if the photon is ejected to the diode surface with a large angle, the photon can be extracted from the side of the trench that is exposed by etching or polishing the spiral-shaped pattern, whereby the extraction efficiency of photon is increased.

BRIEF DESCRIPTION OF THE DRAWINGS

The above features of the present invention will be more clearly understood from consideration of the following descriptions in connection with accompanying drawings in which:

FIG. 1b illustrates a cross-sectional view of a structure of conventional III-nitride LED along the A–A' line in the FIG. 1a;

DETAILED DESCRIPTION OF THE PREFERRED EMBODIMENT

In the following, the present invention is described with a preferred embodiment. While the manufacturing method of III-nitride LED having the electrodes with the spiral-shaped pattern is explained, the structure of III-nitride LED is also described at the same time.

Figure 1A:
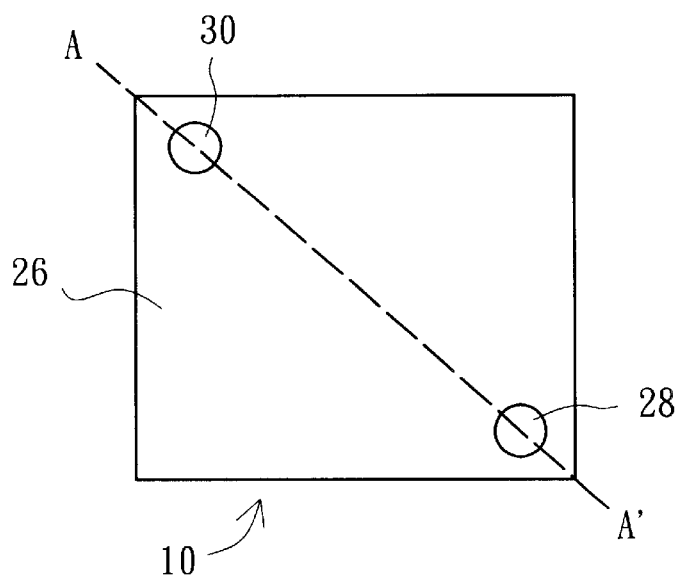
FIG. 1a illustrates a top view of a structure of conventional III-nitride LED.
Figure 1B:
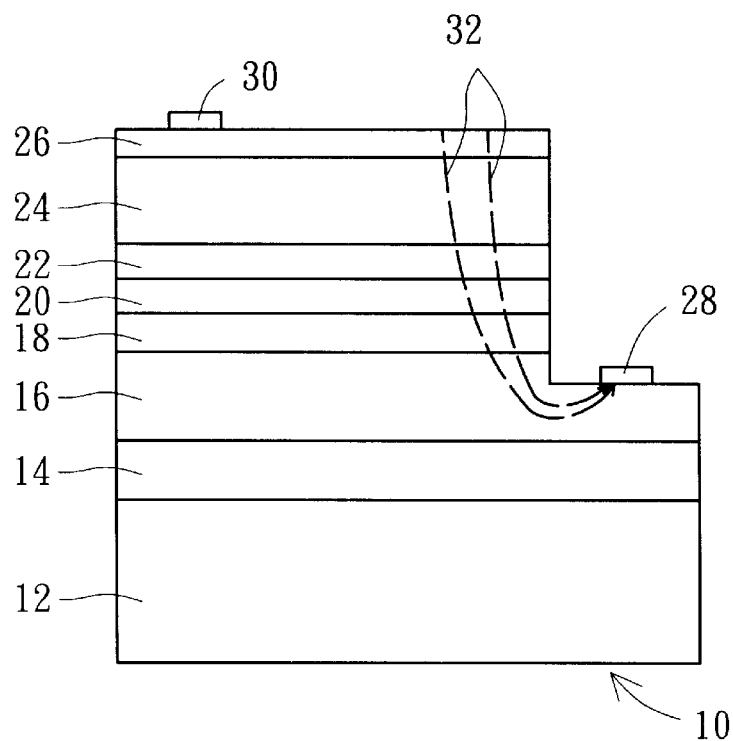
Figure 2A:
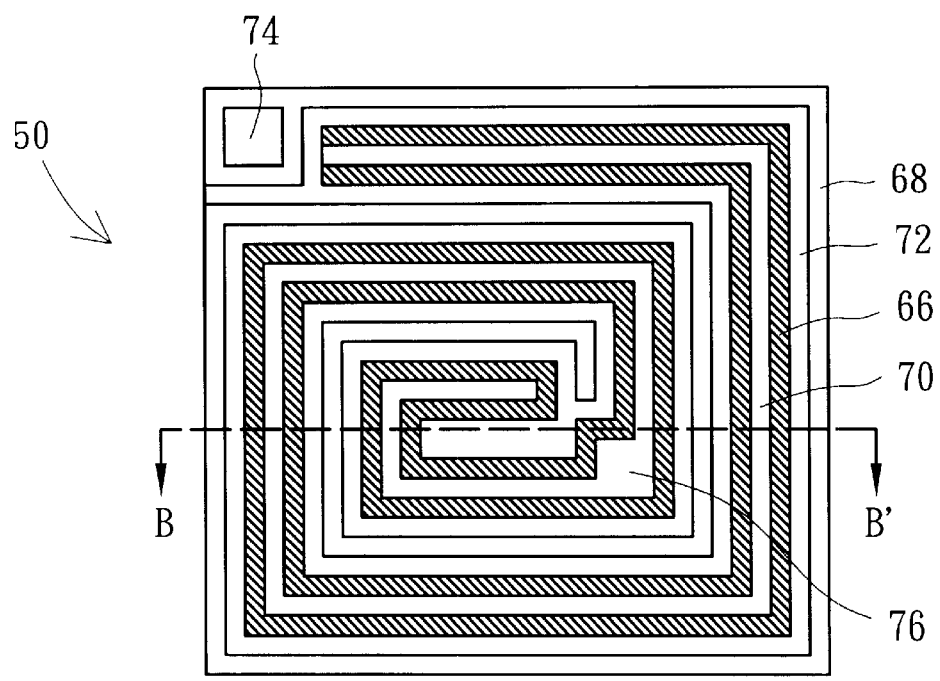
FIG. 2a illustrates a top view of a structure of III-nitride LED having the spiral-shaped pattern electrodes, according to the present invention.
Figure 2B:
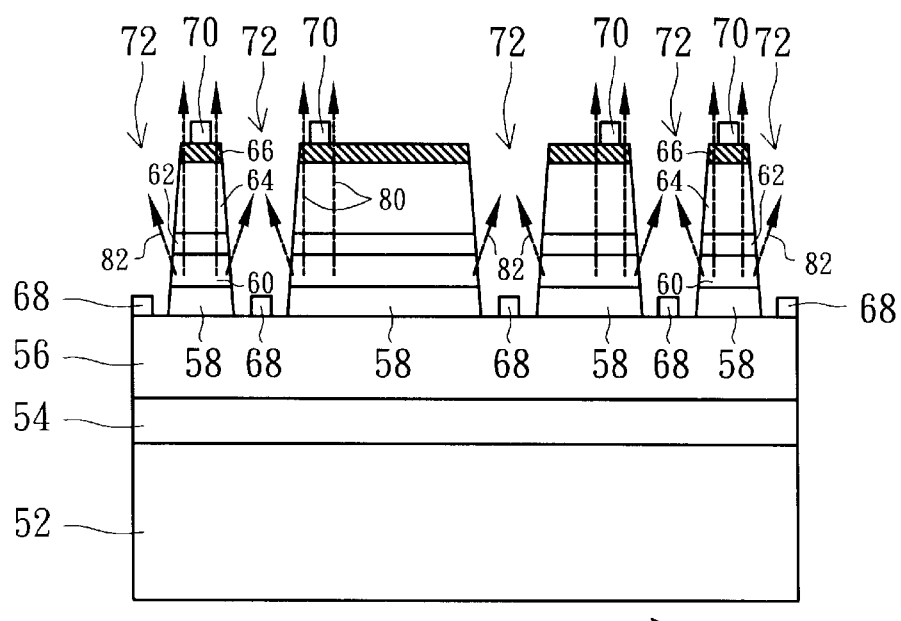
FIG. 2b illustrates a cross-sectional view of a structure of III-nitride LED having the electrodes with the spiral-shaped pattern electrodes along the B–B' line in the FIG. 2a, according to the present invention.

FIG. 2a illustrates a top view of a structure of III-nitride LED having the electrodes with the spiral-shaped pattern of the present invention, and FIG. 2b illustrates a cross-sectional view of a structure of III-nitride LED having the electrodes with the spiral-shaped pattern along the B–B' line in the FIG. 2a, according to the present invention. Referring to the FIG. 2a and FIG. 2b at the same time, a substrate 52 is first provided, and then an epitaxial structure is formed on the substrate 52 by the method of metal organic chemical vapor deposition (MOCVD) or molecular-beam epitaxy (MBE). In the preferred embodiment, the epitaxial structure comprises, sequentially from the bottom to the top, a buffer layer 54, a semiconductor layer 56 having a first electrical property, a confining layer 58 having the first electrical property, an active layer 60, a confining layer 62 having a second electrical property, and a contact layer 64 having the second electrical property, wherein the first electrical property is opposite to the second electrical property. The steps of forming an epitaxial structure are known by the person skilled in the art, and therefore are not described herein.

Then, a removing step is performed. A portion of the epitaxial structure is etched or polished to form a trench 72 in the epitaxial structure, and a portion of a surface of the semiconductor layer 56 having the first electrical property is exposed through the trench 72. The epitaxial structure remained, which is named an epitaxial sub-structure according to the present invention, is formed in the spiral-shaped pattern as shown in FIG. 2a. Moreover, with the different products, processes, and etching methods, the exposed side of the aforementioned epitaxial sub-structure can be in the shape of a plane, a paraboloid, or any other curved surfaces. In other words, viewing from the cross-sectional structure shown in FIG. 2b, the slope of the trench 72 can be a line, a parabola, or any other curves, but the present invention is not limited thereto. The aforementioned removing step can utilize the method selected from the group consisting of dry etching, wet etching, mechanical cutting and polishing, but the present invention is not limited thereto. The operating principles of these methods of dry etching, wet etching and mechanical cutting are known by the person skilled in the art, and are not described herein.

Then, a metal electrode 68 having the first electrical property and a metal electrode pad 74 having the first electrical property are formed in the trench 72. In other words, they are formed on an exposed surface of the semiconductor layer 56 having the first electrical property, and the exposed surface is not covered by the epitaxial sub-structure. The aforementioned metal electrode 68 having the first electrical property is formed along the epitaxial sub-structure, thus having the same spiral-shaped pattern, and is connected with the metal electrode pad 74 having the first electrical property. Thereafter, an ohmic electrode having a second electrical property is formed on the epitaxial sub-structure, wherein the ohmic electrode comprises a transparent electrode and an opaque electrode. The transparent electrode is the transparent electrode 66 having the second electrical property, and the opaque electrode is the metal electrode 70 having the second electrical property, and the metal electrode pad 76 having the second electrical property, wherein the metal electrode 70 having the second electrical property and the metal electrode pad 76 having the second electrical property are located on the transparent electrode 66 having the second electrical property. Since the transparent electrode 66 having the second electrical property and the metal electrode 70 having the second electrical property are formed on the epitaxial sub-structure, they have the same spiral-shaped pattern with the epitixal sub-structure. After the aforementioned steps are performed, the LED 50 of the present invention is fabricated, and the spiral-shaped pattern of the LED of the present invention's preferred embodiment is shown in FIG. 2a.

The aforementioned metal electrode 68 having the first electrical property, the metal electrode pad 74 having the first electrical property, the transparent electrode 66 having the second electrical property, the metal electrode 70 having the second electrical property, and the metal electrode pad 76 having the second electrical property are formed by using the method of thermal evaporation, e-beam evaporation, or ion sputtering, but the present invention is not limited thereto. The operating principles of the methods of thermal evaporation, e-beam evaporation, and ion sputtering are known by the person skilled in the art, and are not described herein. The metal electrode pad 74 having the first electrical property and the metal electrode pad 76 having the second electrical property can be connected to anywhere of the metal electrode 68 having the first electrical property and that of the metal electrode 70 having the second electrical property. The metal electrode pad 74 having the first electrical property and the metal electrode pad 76 having the second electrical property can be in the shape of a square, a circle, a star, or any other forms.

Figure 3:
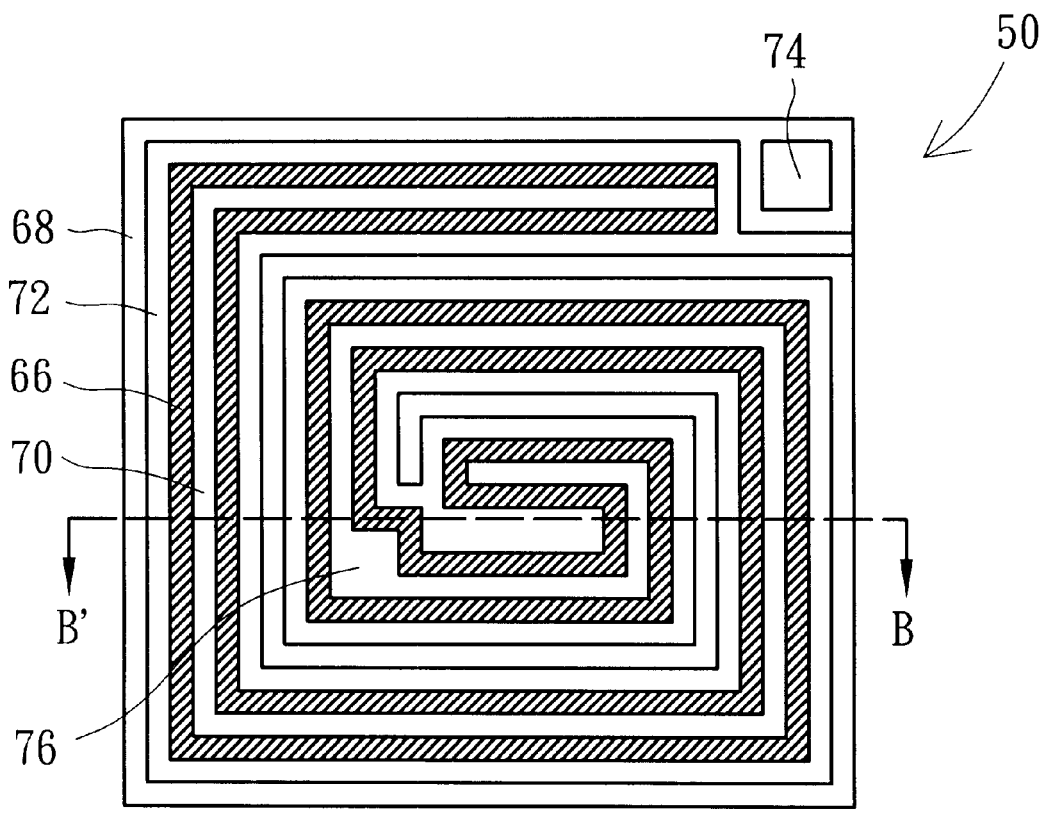
FIG. 3 illustrates a top view of the structure of III-nitride LED having the electrodes with the spiral-shaped pattern, according to another embodiment of the present invention.

Besides the aforementioned preferred embodiment, according to the present invention, in the LED 50 having spiral electrode, the spiral trench 72 formed by etching or polishing and the spiral-shaped epitaxial sub-structure formed thereby can be in the clockwise or counterclockwise shape of a square spiral, a round spiral or spirals having any other shapes. However, the present invention is not limited thereto. Hence, the spiral-shaped pattern of the LED 50 of the present invention can have different arrangements in accordance with different spiral shapes. For instance, FIG. 2a shows a counterclockwise spiral pattern according to the aforementioned preferred embodiment, and the FIG. 3 shows a clockwise spiral pattern according to another preferred embodiment.

Further, the aforementioned epitaxial structure is merely an example for the LED having spiral electrode according to the present invention, and the scope of the present invention is not limited thereto. Other epitaxial structures that are changed in accordance with the changes of products or processes can also be applied in the LED of the present invention having spiral electrode, such as the epitaxial structure without the contact layer 64 having the second electrical property.

In a preferred embodiment of the present invention, the LED is made of: the substrate 52 which is a sapphire substrate; the semiconductor layer 56 having the first electrical property composed of $(Al_xGa_{1-x})_yIn_{1-y}N$ ($0 \leq x \leq 1$; $0 \leq y \leq 1$); the buffer layer 54 composed of AlN or GaN; the confining layer 58 having the first electrical property composed of $(Al_xGa_{1-x})_yIn_{1-y}N$ ($0 \leq x \leq 1$; $0 \leq y \leq 1$); the active layer 60 composed of the double hetero-junction structure or the quantum well of $(Al_xGa_{1-x})_yIn_{1-y}N$ ($0 \leq x \leq 1$; $0 \leq y1$); the confining layer 62 having the second electrical property composed of $(Al_xGa_{1-x})_yIn_{1-y}N$ ($0 \leq x \leq 1$; $0 \leq y \leq 1$); and, the contact layer 64 having the second electrical property composed of $(Al_xGa_{1-x})_yIn_{1-y}N$ ($0 \leq x \leq 1$; $0 \leq y \leq 1$).

Furthermore, in the LED 50 of the present invention having spiral electrodes, if the first electrical property is negative and the second electrical property is positive, then the electrodes is made of: the metal electrode 68 having the first electrical property composed of the single-layer structure or multi-layer structure of Ti, Al, Au, and metal or alloys; the metal electrode pad 74 having the first electrical property composed of the single-layer structure or multi-layer structure of Ti, Al, Au, and metal or alloys; the transparent electrode 66 having the second electrical property composed of the single-layer structure or multi-layer structure of Ni, Au, and metal or alloys, or any other metal-oxide having electric conductivity; the metal electrode 70 having the second electrical property composed of the single-layer structure or multi-layer structure of Ni, Au, and metal or alloys, or metal having high electric conductivity and high adhesion of the metal electrode 66 having the second electrical property; and the metal electrode pad 76 having the second electrical property composed of the single-layer structure or multi-layer structure of Ni, Au, and metal or alloys.

It is noted that the aforementioned material of the LED 50 of the present invention having spiral electrode is merely stated as an example, and the scope of the present invention is not limited thereto. Other materials can also be used in the present invention to form the III-nitride LED having spiral electrodes.

In them III-nitride LED 50 of the present invention having spiral electrodes, the second transparent electrode 66 having the second electrical property, the metal electrode 70 having the second electrical property, and the metal electrode 68 having the first electrical property are the spiral-shaped pattern structures formed in parallel, so that the injected current can evenly distributed between two electrodes whose electrical property are opposite. The present invention has the advantages of good current-spreading efficiency and the uniform light-emitting area. In addition, the present invention uses an etching or polishing method to form spiral-shaped trench 72 on the surface of epitaxial structure of LED 50, so that the photon ejected with large angle by the light-emitting area can be almost extracted from the trench 72 to the surface of LED, such as the light 80 and light 82 shown in the FIG. 2b. Therefore, the present invention has the advantage of increasing the photon extraction efficiency.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A structure of III-nitride LED having spiral electrodes, comprising:
    a substrate;
    an epitaxial structure located on the substrate, the epitaxial structure comprising:
        a first stacked sub-structure located on the substrate; and
        a second stacked sub-structure with a spiral-shaped pattern formed on the first stacked structure, wherein the second stacked sub-structure has a trench, and the trench exposes a side of the second stacked sub-structure and a portion of a surface of the first stacked sub-structure;
    a first metal electrode having a first electrical property, wherein the first metal electrode having the first electrical property is in the trench and located on the first stacked sub-structure along the second stacked sub-structure in the spiral-shaped pattern, and the first metal electrode having the first electrical property is connected with a first metal electrode pad having the first electrical property; and
    an ohmic electrode having a second electrical property, wherein the ohmic electrode having the second electrical property is located on the second stacked substructure, and the second electrical property is opposite to the first electrical property, the ohmic electrode having the second electrical property comprising:
        a transparent electrode having the second electrical property, wherein the transparent electrode having the second electrical property is located on the second stacked sub-structure; and
        a second metal electrode having the second electrical property, wherein the second metal electrode having the second electrical property is located on the transparent electrode having the second electrical property, and the second metal electrode having the second electrical property is connected with a second metal electrode pad having the second electrical property.

2. The structure of III-nitride LED having spiral electrodes according to claim 1, wherein the substrate is a sapphire substrate.

3. The structure of III-nitride LED having spiral electrodes according to claim 1, wherein the first stacked sub-structure comprises a semiconductor layer having the first electrical property, the semiconductor layer having the first electrical property exposing the portion of the surface and being composed of $(Al_xGa_{1-x})_yIn_{1-y}N$ ($0 \leq x \leq 1$; $0 \leq y \leq 1$).

4. The structure of III-nitride LED having spiral electrodes according to claim 3, wherein the first stacked sub-structure comprises a buffer layer located between the semiconductor layer having the first electrical property and the substrate, the buffer layer being composed of the material selected from a group consisting of AlN and GaN.

5. The structure of III-nitride LED having spiral electrodes according to claim 1, wherein the side of the second stacked sub-structure has a shape selected from a group consisting of a plane, a paraboloid, and any other curved surfaces.

6. The structure of III-nitride LED having spiral electrodes according to claim 1, wherein the second stacked sub-structure comprises:
    a first confining layer having the first electrical property, wherein the first confining layer having the first electrical property is located on the first stacked substructure, and is composed of $(Al_xGa_{1-x})_yIn_{1-y}N$ ($0 \leq x \leq 1$; $0 \leq y \leq 1$);
    an active layer located on the first confining layer having the first electrical property, wherein the active layer is composed of the material selected from a group consisting of a double hetero-junction structure and a quantum well of $(Al_xGa_{1-x})_yIn_{1-y}N$ ($0 \leq x \leq 1$; $0 \leq y \leq 1$); and
    a second confining layer having the second electrical property, wherein the second confining layer having the second electrical property is located on the active layer, and the second confining layer having the second electrical property composed of $(Al_xGa_{1-x})_yIn_{1-y}N$ ($0 \leq x \leq 1$; $0 \leq y \leq 1$).

7. The structure of III-nitride LED having spiral electrodes according to claim 6, wherein the side of the second stacked sub-structure further comprises a contact layer having the second electrical property on the second electrical confining, and the contact layer having the second electrical property is composed of $(Al_xGa_{1-x})_yIn_{1-y}N$ ($0 \leq x \leq 1$; $0 \leq y \leq 1$).

8. The structure of III-nitride LED having spiral electrodes according to claim 1, wherein the first electrical metal pad having the first electrical property and the second electrical metal pad having the second electrical property have the shapes selected from a group consisting of a square, a round, a star, and any other shapes.

9. The structure of III-nitride LED having spiral electrodes according to claim 1, if the first electrical property is negative and the second electrical property is positive, then:

the first metal electrode having the first electrical property is composed of the material selected from a group consisting of the single-layer structure and multi-layer structure composed of Ti, Al, Au, and alloys thereof;

the first metal electrode pad having the first electrical property is composed of the material selected from a group consisting of the single-layer structure and multi-layer structure of Ti, Al, Au, and alloys thereof;

the transparent electrode having the second electrical property is composed of the material selected from a group consisting of the single-layer structure and multi-layer structure of Ni, Au, and alloys thereof, and any other metal-oxides having electric conductivity;

the second metal electrode having the second electrical property is composed of the material selected from a group consisting of the single-layer structure and multi-layer structure of Ni, Au, and alloys thereof, and metals having high electric conductivity and high adhesion with the transparent electrode; and the second metal electrode pad having the second electrical property is composed of the material selected from a group consisting of the single-layer structure and multi-layer structure of Ni, Au, and alloys thereof.

10. The structure of III-nitride LED having spiral electrodes according to claim 1, wherein the spiral-shaped pattern is selected from a group consisting of the counter-clockwise and clockwise structures of a square spiral, a round spiral and the spirals having any other forms.

* * * * *